(12) United States Patent
Abe et al.

(10) Patent No.: US 11,647,265 B2
(45) Date of Patent: May 9, 2023

(54) ELECTRONIC APPARATUS, IMAGING APPARATUS, AND MOBILE BODY

(71) Applicant: KYOCERA Corporation, Kyoto (JP)

(72) Inventors: Hiroyuki Abe, Yokohama (JP); Takahiro Okada, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/269,616

(22) PCT Filed: Aug. 23, 2019

(86) PCT No.: PCT/JP2019/033158
§ 371 (c)(1),
(2) Date: Feb. 19, 2021

(87) PCT Pub. No.: WO2020/045307
PCT Pub. Date: Mar. 5, 2020

(65) Prior Publication Data
US 2021/0344817 A1 Nov. 4, 2021

(30) Foreign Application Priority Data
Aug. 28, 2018 (JP) .............................. JP2018-159392

(51) Int. Cl.
*H04N 5/225* (2006.01)
*B60R 11/04* (2006.01)
*G03B 17/12* (2021.01)
*H05K 1/02* (2006.01)
*H05K 1/18* (2006.01)
*B60R 11/00* (2006.01)

(52) U.S. Cl.
CPC ........... *H04N 5/2252* (2013.01); *B60R 11/04* (2013.01); *G03B 17/12* (2013.01); *H04N 5/2253* (2013.01); *H05K 1/0274* (2013.01); *H05K 1/182* (2013.01); *B60R 2011/0021* (2013.01); *H05K 2201/10121* (2013.01)

(58) Field of Classification Search
CPC ... B60R 11/04; B60R 2011/0021; G02B 7/02; G03B 17/12; G03B 30/00; H04N 5/2252; H04N 5/2253; H05K 1/0274; H05K 1/182; H05K 2201/10121
See application file for complete search history.

(56) References Cited

U.S. PATENT DOCUMENTS

| | | | |
|---|---|---|---|
| 2012/0320544 A1 | 12/2012 | Ohhashi et al. | |
| 2017/0023775 A1* | 1/2017 | Shigemitsu | G02B 3/04 |
| 2018/0231872 A1* | 8/2018 | Tahara | G02B 7/021 |
| 2021/0364729 A1* | 11/2021 | Lee | H04N 5/2254 |
| 2022/0070378 A1* | 3/2022 | Wade | G02B 27/646 |
| 2022/0086316 A1* | 3/2022 | Toriumi | G03B 17/17 |

FOREIGN PATENT DOCUMENTS

| | | |
|---|---|---|
| JP | 2003-108968 A | 4/2003 |
| JP | 2010-251843 A | 11/2010 |
| JP | 2012-047816 A | 3/2012 |

* cited by examiner

*Primary Examiner* — Amy R Hsu

(74) *Attorney, Agent, or Firm* — Studebaker & Brackett PC

(57) ABSTRACT

An electronic apparatus includes a substrate, a housing, and an adhesive. The housing has opposing surfaces respectively opposing side surfaces of a first diagonal portion and second diagonal portion serving as a pair of diagonal portions of the substrate and encloses the substrate. The adhesive is positioned between the side surfaces of the first diagonal portion and the second diagonal portion of the substrate and the opposing surfaces of the housing.

15 Claims, 16 Drawing Sheets

ELECTRONIC APPARATUS, IMAGING APPARATUS, AND MOBILE BODY

CROSS REFERENCE TO RELATED APPLICATION

This application claims priority to and the benefit of Japanese Patent Application No. 2018-159392 filed on Aug. 28, 2018, the entire contents of which are incorporated herein by reference.

TECHNICAL FIELD

The present disclosure relates to an electronic apparatus, an imaging apparatus, and a mobile body.

BACKGROUND

In electronic apparatuses, screws are generally used to fix a substrate having circuit components mounted thereon to a housing. However, in a case in which the screws are used for fixing, when the screws are tightened, a force may be applied between the substrate and the housing and may inhibit maintaining the accuracy of a mounting position. For this reason, it has been proposed to use an adhesive to fix the substrate and the housing. For example, in PTL1 set forth below, a convex portion is provided in an enclosure portion on a housing side for enclosing a substrate, and an adhesive is applied to the convex portion to attach the substrate having electronic components mounted thereon.

CITATION LIST

Patent Literature

PTL 1: JP-A-2003-108968

SUMMARY

An electronic apparatus according to the present disclosure includes a substrate, a housing, and an adhesive. The housing has opposing surfaces respectively opposing side surfaces of a pair of diagonal portions of the substrate and encloses the substrate. The adhesive is positioned between the side surfaces of the pair of diagonal portions of the substrate and the opposing surfaces of the housing.

An imaging apparatus according to the present disclosure includes an imaging optical system, an image sensor, a substrate, a housing, and an adhesive. The image sensor converts an image of a subject formed by the imaging optical system into an electric signal. The substrate has a circuit component including the image sensor mounted thereon. The housing supports the imaging optical system, has opposing surfaces opposing respective side surfaces of a pair of diagonal portions of the substrate, and encloses the substrate. The adhesive is positioned between the side surfaces of the pair of diagonal portions of the substrate and the opposing surfaces of the housing.

A mobile body according to the present disclosure is equipped with an imaging apparatus. The imaging apparatus includes an imaging optical system, an image sensor, a substrate, a housing, and an adhesive. The image sensor converts an image of a subject formed by the imaging optical system into an electric signal. The substrate has the image sensor mounted thereon. The housing supports the imaging optical system, has opposing surfaces opposing respective side surfaces of a pair of diagonal portions of the substrate, and encloses the substrate. The adhesive is positioned between the side surfaces of the pair of diagonal portions of the substrate and the opposing surfaces of the housing.

DETAILED DESCRIPTION

Electronic apparatuses may be used in an environment subject to vibrations, including a position in a mobile body such as a vehicle. Also, the electronic apparatuses may be carried by people during walking or exercising and subjected to an impact caused by a drop or collision thereof while being used. In a case in which a substrate is fixed to a housing by an adhesive, there is a concern that, upon application of a vibration or an impact to the electronic apparatus, a stress caused by the vibration or the impact converges at a particular position on an adhesion surface, causing peeling. In particular, in a case in which the electronic component mounted on the substrate has a heavy weight, the stress applied to the adhesion surface when subjected to the vibration or impact increases, and there is a great risk of the peeling of the adhesive.

The present disclosure relates to an electronic apparatus that uses an adhesive to secure a substrate to a housing and is capable of reducing the possibility of the peeling of the adhesive caused by a vibration or an impact, an imaging apparatus, and a vehicle having the electronic apparatus and the imaging apparatus mounted thereon.

Prior to descriptions of the electronic apparatuses and the like according to the present disclosure, configurations of comparative examples assumed to be methods for fixing the substrate and the housing using an adhesive will be described.

Figure 16:
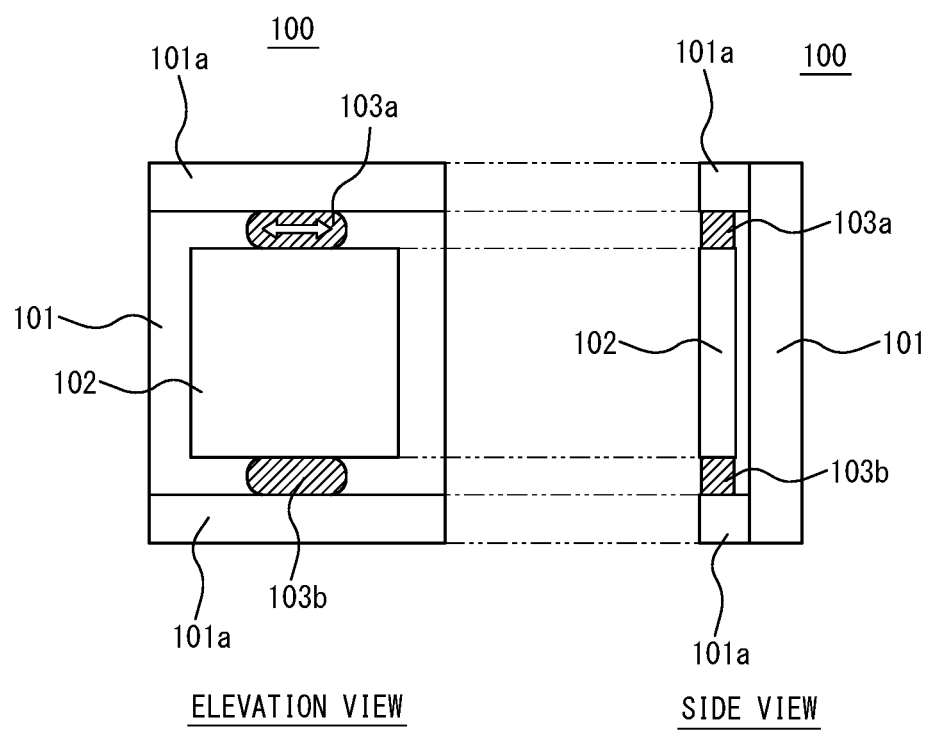
FIG. 16 is a diagram illustrating an adhesion state between a housing and a substrate according to comparative example 1.

FIG. 16 illustrates an elevation view and a side view of an attaching configuration 100 according to comparative example 1 in which a substrate 102 is attached to a housing 101. The attaching configuration 100 includes the housing 101, the substrate 102, and adhesives 103a and 103b. In FIG. 16 and other drawings, the adhesives are highlighted by shading.

The housing 101 is a member having a rectangular plate-like shape when viewed from a front side. The housing 101 includes a pair of protrusions 101a protruding to a side having the substrate 102 provided thereon, along upper and lower sides of the housing 101 when FIG. 16 is viewed from the front side. The substrate 102 is a rectangular substrate having a circuit component mounted thereon. The substrate 102 is arranged between the protrusions 101a in a manner such that upper and lower surfaces of the substrate 102 oppose corresponding protrusions 101a when FIG. 16 is viewed from the front side.

The adhesive 103a is positioned between the protrusion 101a on the upper side of the housing 101 illustrated in FIG. 16 and the upper surface of the substrate 102. The adhesive 103b is positioned between the protrusion 101b on the lower side of the housing 101 illustrated in FIG. 16 and the lower surface of the substrate 102. The adhesives 103a and 103b fix the substrate 102 to the housing 101. As the adhesives 103a and 103b, an ultraviolet (UV) curable adhesive or a heat-curable adhesive may be used.

When the attaching configuration 100 of the electronic apparatus illustrated in FIG. 16 is subjected to a vibration or an impact, the substrate 102 can be shaken, for example, in a direction parallel to an extending direction of the protrusion 101a of the housing 101, as indicated by a double-headed arrow. In this case, the adhesives 103a and 103b are subjected to a force in a shearing direction, which can cause the adhesives to peel off from the protrusions 101a of the housing 101 and the substrate 102. The shearing direction means two opposing directions that extend along an adhesion surface across the adhesion surface attached by the adhesive.

Figure 17:
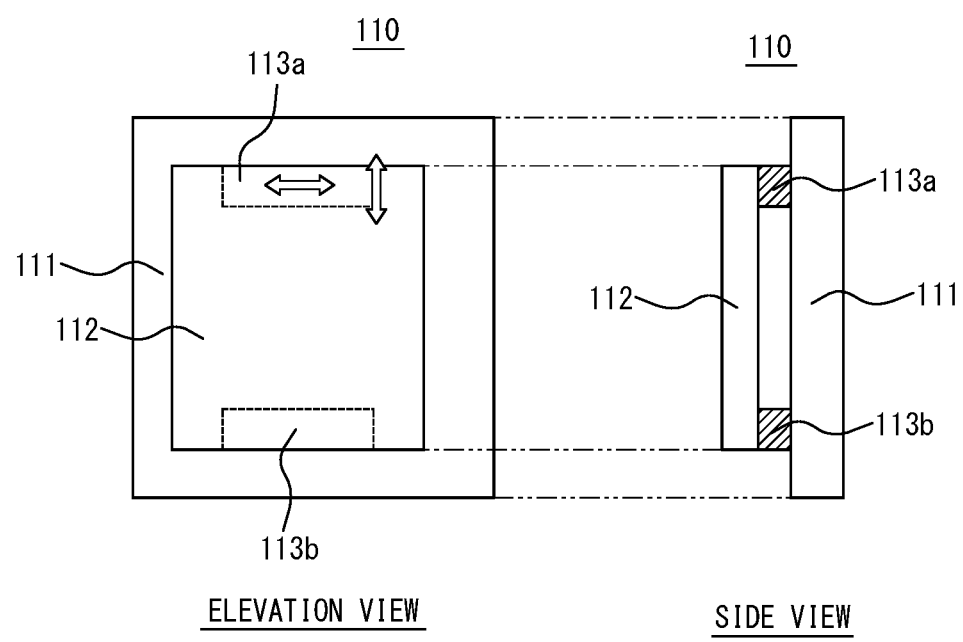
FIG. 17 is a diagram illustrating an adhesion state between a housing and a substrate according to comparative example 2.

FIG. 17 illustrates an elevation view and a side view of an attaching configuration 110 according to comparative example 2 in which a substrate 112 is attached to a housing 111. The attaching configuration 110 includes the housing 111, the substrate 112, and adhesives 113a, 113b. The housing 111 is a member having a rectangular plate-like shape when viewed from the front side. The substrate 112 has a rectangular exterior shape that is smaller than an exterior shape of the housing 111 when viewed from the front side. The housing 111 and the substrate 112 are arranged opposing each other. In a region where the substrate 112 and the housing 111 opposes each other between the housing 111 and the substrate 112, adhesives 113a and 113b are arranged along upper and lower surfaces of the substrate 112 when FIG. 17 is viewed from the front side.

When the attaching configuration 110 of the electronic apparatus illustrated in FIG. 17 is subjected to a vibration or an impact, the substrate 112 can be shaken, for example, in up-down and left-right directions as indicated by double-headed arrows within its plane opposing the housing 111. In this case, a force in the shearing direction is applied to the adhesives 113a and 113b and may cause the adhesives 113a and 113b to be peeled off from the housing 111 and the substrate 112.

Figure 18:
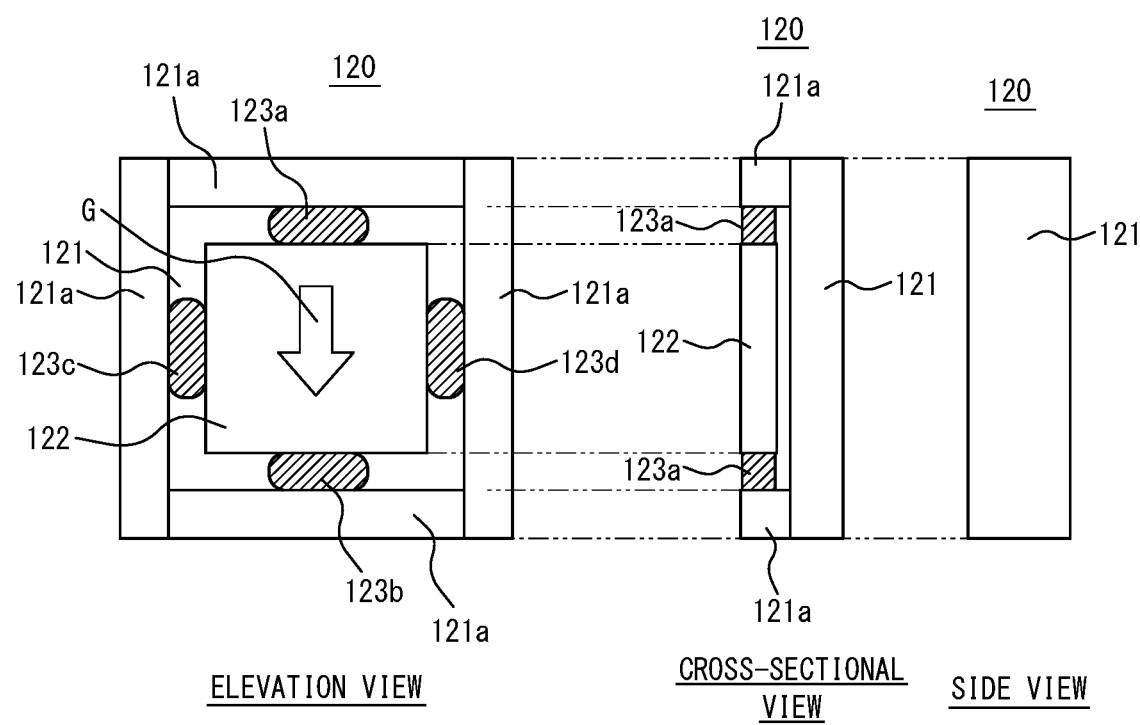
FIG. 18 is a diagram illustrating an adhesion state between a housing and a substrate according to comparative example 3.

FIG. 18 illustrates an elevation view, a cross-sectional view, and a side view of an attaching configuration 120 according to comparative example 3 in which a substrate 122 is attached to the housing 121. The attaching configuration 120 includes the housing 121, the substrate 122, and adhesives 123a to 123d. The housing 121 is a member having a rectangular plate-like shape. The housing 121 has protrusions 121a protruding along each side thereof to a side on which the substrate 122 is arranged. The substrate 122 is arranged in a region surrounded by the protrusions 121a, in a manner such that four peripheral surfaces thereof, which are sides when viewed from the front side, oppose respective inward-facing side surfaces of the protrusions 121a. The adhesives 123a to 123d are arranged in respective portions between the four peripheral surfaces of the substrate 122 and the inward-facing side surfaces of the protrusions 121a.

In the attaching configuration 120 according to comparative example 3, for example, the up-down direction when the elevation view illustrated in FIG. 18 is viewed from the front side corresponds to the vertical direction. Upon application of a load to the substrate 122 in a downward direction indicated by an arrow G, a force in a tensile direction is applied to the adhesive 123a, and a force in a compression direction is applied to the adhesive 123b. Simultaneously, a force in the shear direction is applied to the adhesive 123c and the adhesive 123d. As a result, when the substrate 122 is subjected to a vibration or an impact, a stress is separated into a shearing force, a compressive force, and a tensile force in the adhesives 123a to 123d. Thus, a convergent application of the stress to a particular one of the adhesives 123a to 123d can be avoided.

In the attaching configuration 120 of the electronic apparatus illustrated in FIG. 18, however, because the substrate 122 needs to be covered in all directions along four peripheral surfaces thereof, the housing is enlarged. Preferably, the substrate in the electronic apparatus can be attached without enlarging the housing.

Hereinafter, an embodiment of the present disclosure will be described with reference to the drawings. The drawings used herein are merely schematic. The drawings are not necessarily drawn to scale. In the following description, further, terms such as upper, lower, horizontal, and vertical may be used as respective directions when the drawings are viewed from the front side. However, such directions are not limited to the vertical or horizontal direction in relation to gravity, unless otherwise specified. The "upper" and "lower" can be interchanged, and the "horizontal" and "vertical" can also be interchanged, as desired.

Configuration of Imaging Apparatus

Figure 1:
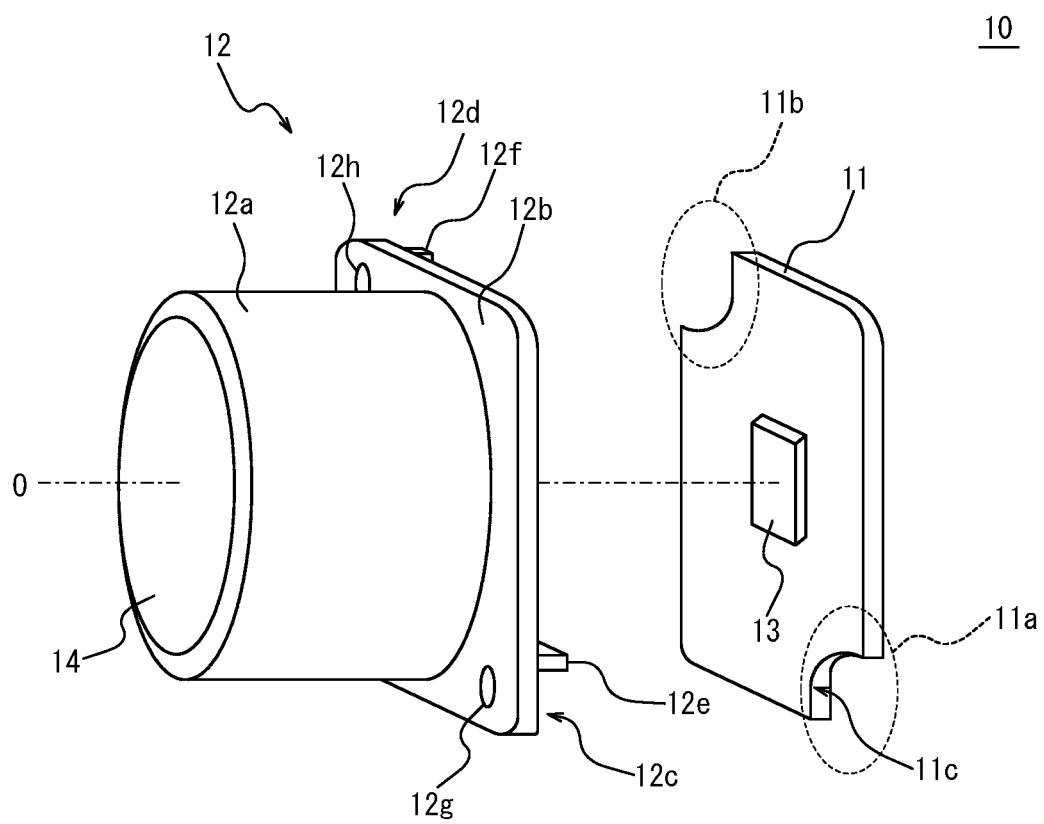
FIG. 1 is an exploded perspective view of a portion of an imaging apparatus according to an embodiment.
Figure 2:
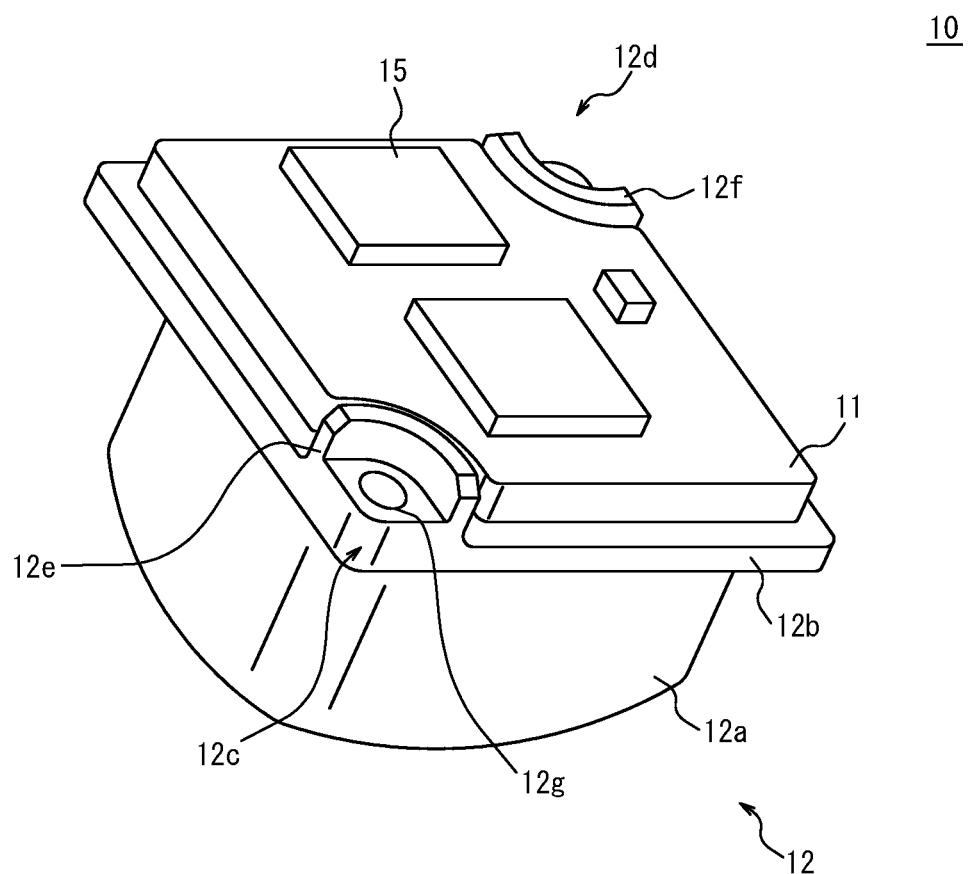
FIG. 2 is a perspective view of the imaging apparatus illustrated in FIG. 1 as viewed from a diagonally rear side thereof.

As illustrated in an exploded perspective view in FIG. 1 and a perspective view in FIG. 2, an imaging apparatus 10 serving as an electronic apparatus according to the embodiment of the present disclosure includes a substrate 11, a housing 12, an image sensor 13, and a lens 14 (an imaging optical system).

The substrate 11 can be a printed circuit board having the image sensor 13 and circuit components 15 mounted thereon. The image sensor 13 and the circuit components 15 are fixed to the substrate 11 by soldering or the like. Although a number of circuit components 15 can be mounted on the substrate 11, only a few circuit components 15 are illustrated in FIG. 2.

The image sensor 13 includes a CCD image sensor (Charge-Coupled Device Image Sensor) or a CMOS image sensor (Complementary MOS Image Sensor). The image sensor 13 converts an image of a subject imaged by an optical system that includes the lens 14 into an electric signal. Thus, the image sensor 13 is arranged on a surface of the substrate 11 opposing the lens 14 in a manner such that an optical axis O of the lens 14 passes through the center of a light receiving surface.

The circuit components 15 is configured to control the image sensor 13 and perform various processing on an electric signal that includes image information output from the image sensor 13. The processing performed by the circuit components 15 may include various image processing such as pixel interpolation processing, contrast adjustment, gamma correction, white balance adjustment, and the like.

The housing 12 includes a lens barrel 12a and a base 12b.

The lens barrel 12a holds the imaging optical system that includes the lens 14. The lens barrel 12a is a cylindrical portion that encloses the optical axis O of the lens 14. The lens 14 is not limited to one lens and may include a plurality of lenses. The lens 14 is configured to form an image of a subject on the light receiving surface of the image sensor 13. The lens barrel 12a can enclose optical elements such as a diaphragm, an IR cut filter, and the like, in addition to the lens 14.

The base 12b is positioned at an edge of the lens barrel 12a and protrudes outward from the lens barrel 12a in a radial direction of the lens barrel. The base 12b has a three-dimensional configuration for enclosing the substrate 11. Further, the base 12b has a three-dimensional configuration for fixing other elements including a lid. For example, the base 12b has a plate-like shape and may have a periphery similar to a rectangle shape. Hereinafter, a configuration in which the substrate 11 is fixed to the base 12b of the housing 12 will be described with reference to FIG. 3 to FIG. 6.

Figure 3:
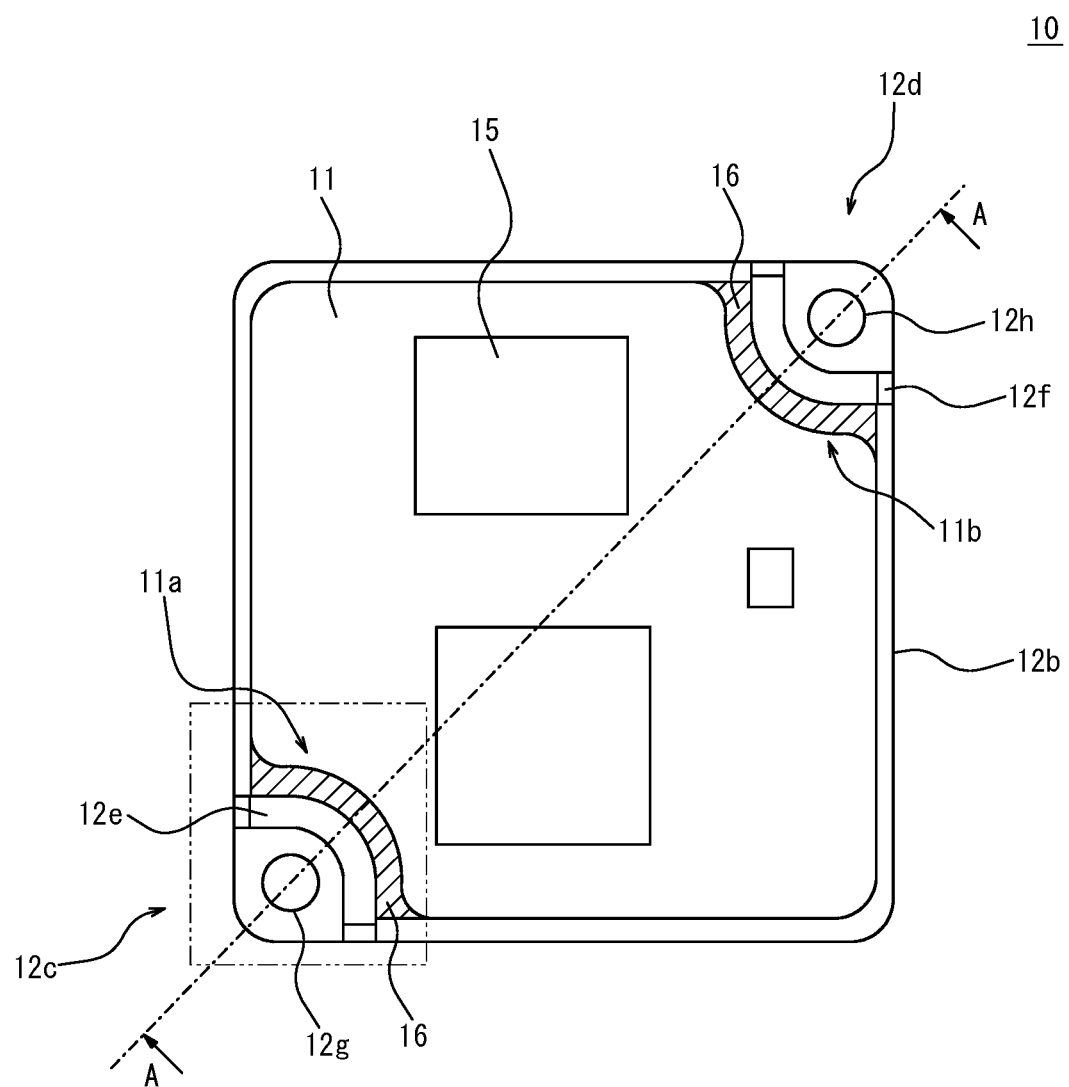
FIG. 3 is a diagram illustrating the imaging apparatus illustrated FIG. 1 as viewed from a substrate side.

The substrate 11 has an approximate square shape, as illustrated in FIG. 3. In the present application, corners included in the approximate square shape opposing each other and their vicinity areas will be referred to as diagonal portions. A region having a distance from a vertex of one corner shorter than a vertex of another corner can be determined to be the vicinity area of the one corner. The vicinity area of the corner can be limited to a region further closer to the vertex of the corner. In a case in which a vertex area of a corner is removed as cut-off or the like, an intersection between extended lines of unremoved sides adjacent to the corner can be regarded as the vertex, and the corner and its vicinity area can be determined accordingly.

A first diagonal portion 11a and a second diagonal portion 11b constituting a pair of diagonal portions of the substrate 11 respectively have a convex cut-off shape protruding in an in-plane direction of the substrate 11. In the imaging apparatus 10, the convex shape may include an arc shape obtained by dividing a circumference into four equal portions. That is, the first diagonal portion 11a and the second diagonal portion 11b respectively have a cut-off shape obtained by cutting off a quarter circle from a right-angled corner of the substrate 11.

Figure 4:
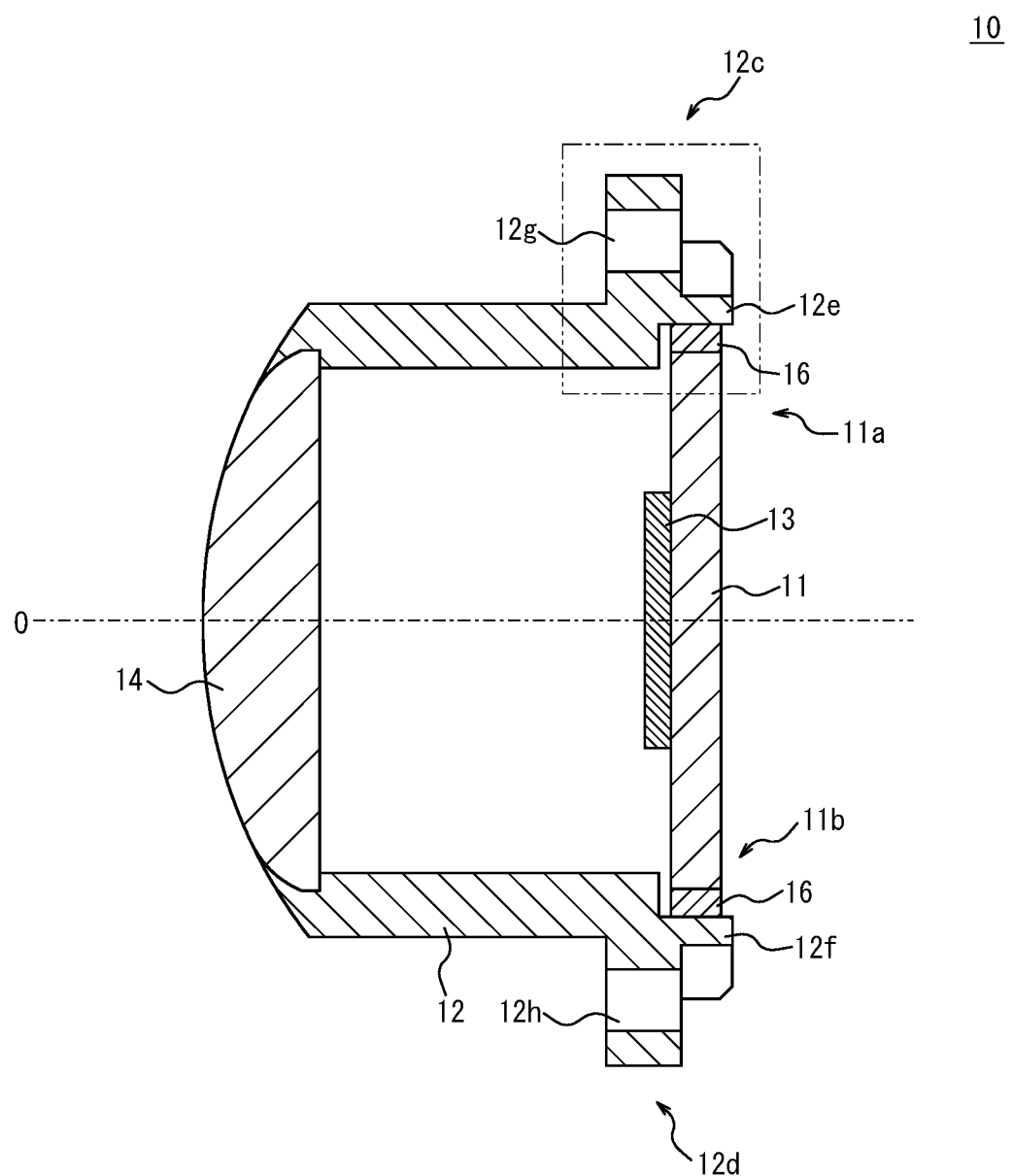
FIG. 4 is a cross-sectional view taken from line A-A of FIG. 3.

The base 12b of the housing 12 includes a first diagonal portion 12c and a second diagonal portion 12d respectively corresponding to the first diagonal portion 11a and the second diagonal portion 11b of the substrate 11. As illustrated in FIG. 3 and FIG. 4, the first diagonal portion 12c includes a first protrusion 12e protruding in an arc in the normal of the surface of the substrate 11, along an end portion of the first diagonal portion 11a of the substrate 11 on a side opposite from a side having the lens 14 arranged thereon. Similarly, the second diagonal portion 12d includes a second protrusion 12f protruding in an arc in the normal of the surface of the substrate 11, along an end portion of the second diagonal portion 11b of the substrate 11 on the side opposite from the side having the lens 14 arranged thereon. A screw hole 12g for attaching the lid of the imaging apparatus 10 may be formed on the outer side of the first protrusion 12e of the first diagonal portion 12c. The second diagonal portion 12d may include a screw hole 12h formed in a similar manner.

Figure 5:
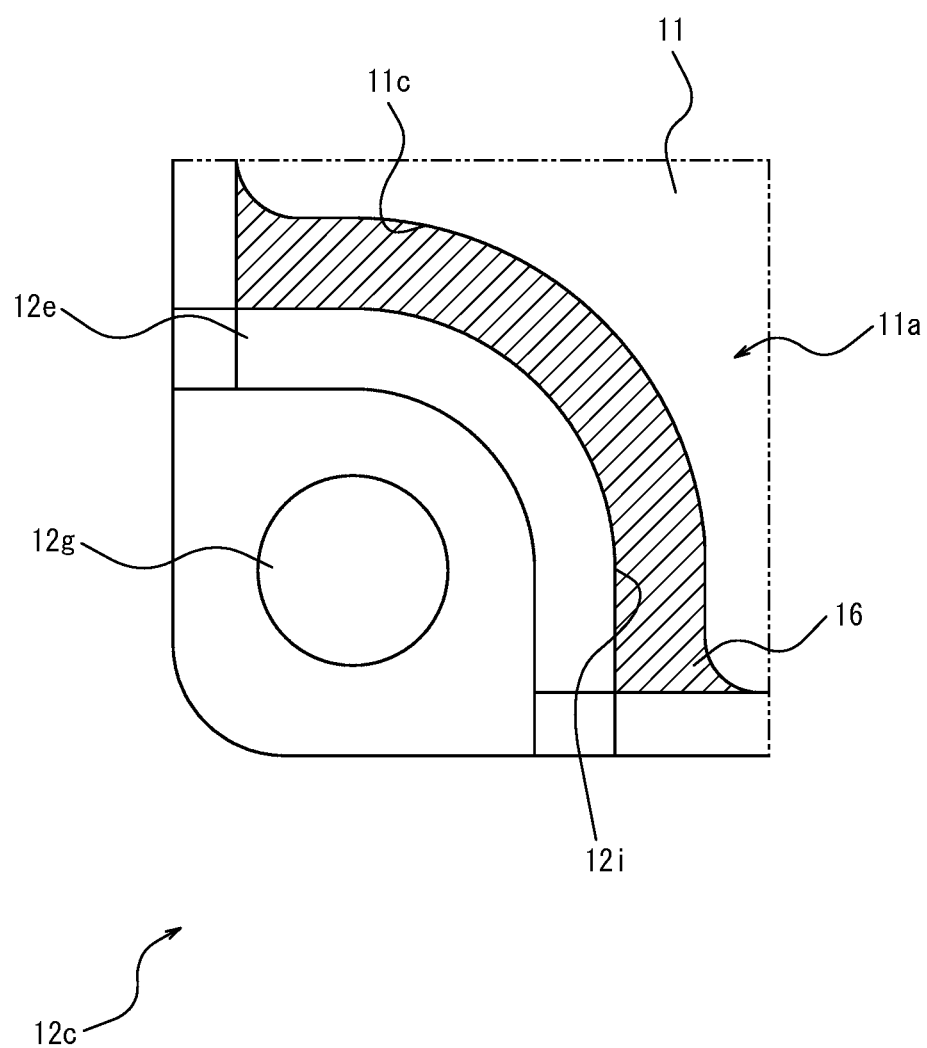
FIG. 5 is an enlarged view of a first diagonal portion illustrated in FIG. 3.
Figure 6:
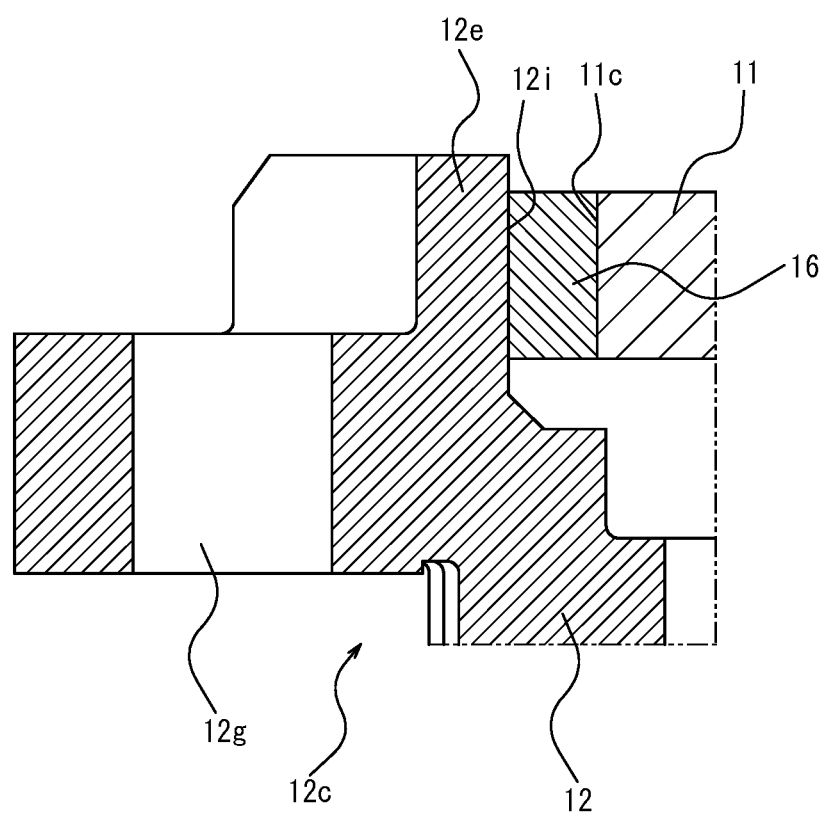
FIG. 6 is an enlarged cross-sectional view of the first diagonal portion illustrated in FIG. 4.

FIG. 5 illustrates an enlarged view of a portion surrounded by two-dot chain lines illustrated in FIG. 3. Also, FIG. 6 illustrates an enlarged view of a portion surrounded by two-dot chain lines illustrated in FIG. 4, by rotating the portion counterclockwise by 90 degrees. As illustrated in the enlarged views of FIG. 5 and FIG. 6, the first protrusion 12e has a first housing side surface 12i, which is a side surface opposing a first substrate side surface 11c serving as a side surface of the first diagonal portion 11a of the substrate 11. As illustrated in FIG. 5, a distance between the first substrate side surface 11c and the first housing side surface 12i is approximately constant over an arcuate circumferential direction.

An adhesive 16 is positioned between the side first substrate side surface 11c and the first housing side surface 12i. The adhesive 16 fixes the first substrate side surface 11c and the first housing side surface 12i by adhesion. In particular, at the time of manufacturing of the imaging apparatus 10, an ultraviolet (UV) curable adhesive or a heat-curable adhesive is filled between the first substrate side surface 11c and the first housing side surface 12i. After filling the adhesive 16, the adhesive 16 is irradiated with UV, or heated, to cure. The second diagonal portion 11b and the second protrusion 12f can also be fixed by adhesion.

There are gaps between the first diagonal portion 11a of the substrate 11 and the first protrusion 12e of the housing 12 and between the second diagonal portion 11b of the substrate 11 and the second protrusion 12f of the housing 12. There is also a gap between the surface of the substrate 11 on the side of the lens 14 and the surface of the housing 12 opposing the base 12b. Thus, at the time of manufacturing of the imaging apparatus 10, the optical axis O of the lens 14 is aligned with the center of the light receiving surface of the image sensor 13 before the adhesive 16 is cured, whereby the position of the substrate 11 may be adjusted with respect to the housing 12 in a direction along the surface of the substrate 11. Further, because an image formation position of the lens 14 is positioned on the light receiving surface of the image sensor 13, the position of the substrate 11 can be adjusted with respect to the housing 12 in the direction along the optical axis O.

After adjusting the positions of the substrate 11 and the housing 12, the adhesive 16 is filled between the first substrate side surface 11c and the first housing side surface 12i and between the second substrate side surface 11d and a second housing side surface 12j by using, for example, a syringe-shaped injection device having a fine tip. Preferably, the adhesive 16 is somewhat viscous to stay in the gap. In a case in which the ultraviolet (UV) curable adhesive is used as the adhesive 16, it can be cured by irradiating ultraviolet rays at the timing when the adhesive 16 is filled.

Next, an effect of the attaching configuration of the substrate 11 on the housing 12 in the imaging apparatus 10 will be described with reference to FIG. 7. The first diagonal portion 11a of the substrate 11 has the convex shape protruding in the in-plane direction. Thus, an orientation of the first substrate side surface 11c greatly differs between the first region 17a and the second region 17b located at either end of the first substrate side surface 11c in contact with the adhesive 16. The first region 17a includes a first adhesion position. The second region 17b includes a second adhesion position. "Orientation of the surface differs" can be rephrased as "Normal differs". For example, the normal of the first substrate side surface 11c can be different by approximately 90 degrees between the first region 17a and the second region 17b. Further, the normal of the first housing side surface 12i of the first protrusion 12e opposing the first substrate side surface 11c can also be different by approximately 90 degrees between the first region 17a and the second region 17b.

In a manner similar to the first diagonal portion 11a, in the second diagonal portion 11b an orientation of the second substrate surface 11d greatly differs between the third region 17c and the fourth region 17d located at either end of the second substrate side surface 11d in contact with the adhesive 16. The third region 17c includes a third adhesion position. The fourth region 17d includes a fourth adhesion position. For example, a normal of the side surface 11d may be different by approximately 90 degrees between the third region 17c and the fourth region 17d. Further, a normal of the second housing side surface 12j of the second protrusion 12f opposing the side surface 11d can also differ by approximately 90 degrees between the third region 17c and the fourth region 17d.

Further, the first substrate side surface 11c and the second substrate side surface 11d may be parallel to each other in the first region 17a and the third region 17c and in the second region 17b and the fourth region 17d. The same applies to the first housing side surface 12i and the second housing side surface 12j.

As described above, in a case in which the substrate 11 is fixed to the base 12b of the housing 12, when, for example, gravity or a vertical vibration in the vertical direction indicated by the arrow G is applied to the substrate 11, a force in the shear direction is applied to the first region 17a and the third region 17c. On the other hand, compression or a force in a tensile direction is applied to the second region 17b and the fourth region 17d. Alternatively, when gravity or a vibration in the direction orthogonal to the arrow G is applied, a force in the shearing direction is applied to the second region 17b and the fourth region 17d, and compression or a force in a tensile direction is applied to the first region 17a and the third region 17c. As a result, the stress applied to the adhesive 16 can be dispersed, whereby the possibility of peeling off and removal of the adhesive 16 can be reduced. Further, because the adhesion is performed in the pair of diagonal portions of the substrate 11 alone, the adhesive 16 does not need to cover the periphery of the substrate 11 in its entirety. Accordingly, the imaging apparatus 10 can reduce the size of the housing 12 and demonstrate excellent space saving properties.

Further, a contact direction of the adhesive 16 with respect to the first substrate side surface 11c in the first region 17a and a contact direction of the adhesive 16 with respect to the second substrate side surface 11d in the third region 17c are opposite to each other. Thus, the substrate 11 is held from both sides in the first region 17a and the third region 17c and thus suppressed from moving in a direction orthogonal to the first substrate side surface 11c and the second substrate side surface 11d. Further, a contact direction of the adhesive 16 with respect to the first substrate side surface 11c in the second region 17b and a contact direction of the adhesive 16 with respect to the second substrate side surface 11d in the fourth region 17d are opposite to each other. Thus, the substrate 11 is held from both sides in the second region 17b and the fourth region 17d and thus suppressed from moving in the direction orthogonal to the first substrate side surface 11c and the second substrate side surface 11d. As a result, the substrate 11 is securely fixed to the housing 12.

Figure 7:
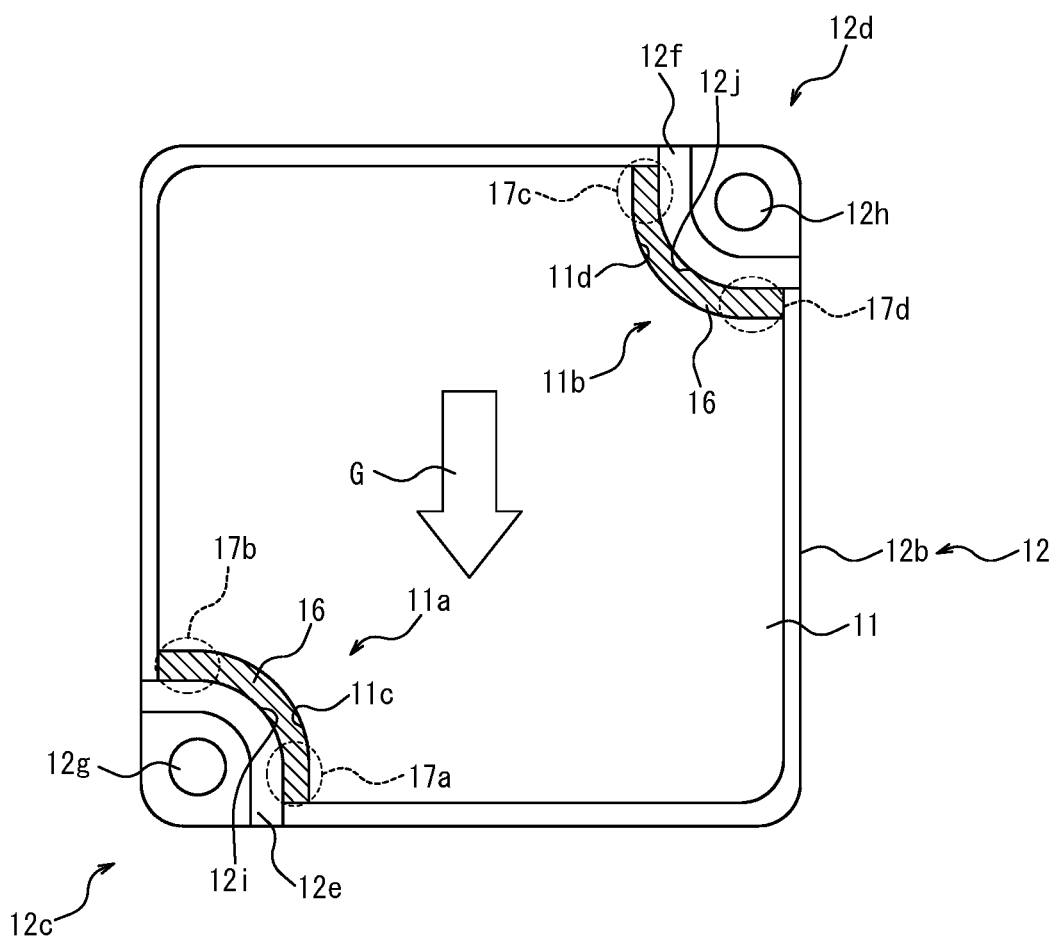
FIG. 7 is a diagram illustrating an adhesion state between a housing and a substrate in the imaging apparatus illustrated in FIG. 1.

In the example illustrated in FIG. 7, further, the orientation of the first substrate side surface 11c differs between the first region 17a and the second region 17b. Also, the orientation of the second substrate side surface 11d differs between the third region 17c and the fourth region 17d. This configuration restricts a movement in the two directions, whereby the substrate 11 is more securely fixed to the housing 12. Further, because movements in the two directions at an angle of approximately 90 degrees from each other are restricted, the substrate 11 is particularly securely fixed to the housing 12.

According to the imaging apparatus 10 (the electronic apparatus) of the present disclosure, as described above, the adhesive 16 can be used to fix the substrate 11 to the housing 12 and, simultaneously, the possibility for peeling off or removal of the adhesive 16 due to a vibration or an impact can be suppressed.

Example Variation 1

Figure 8:
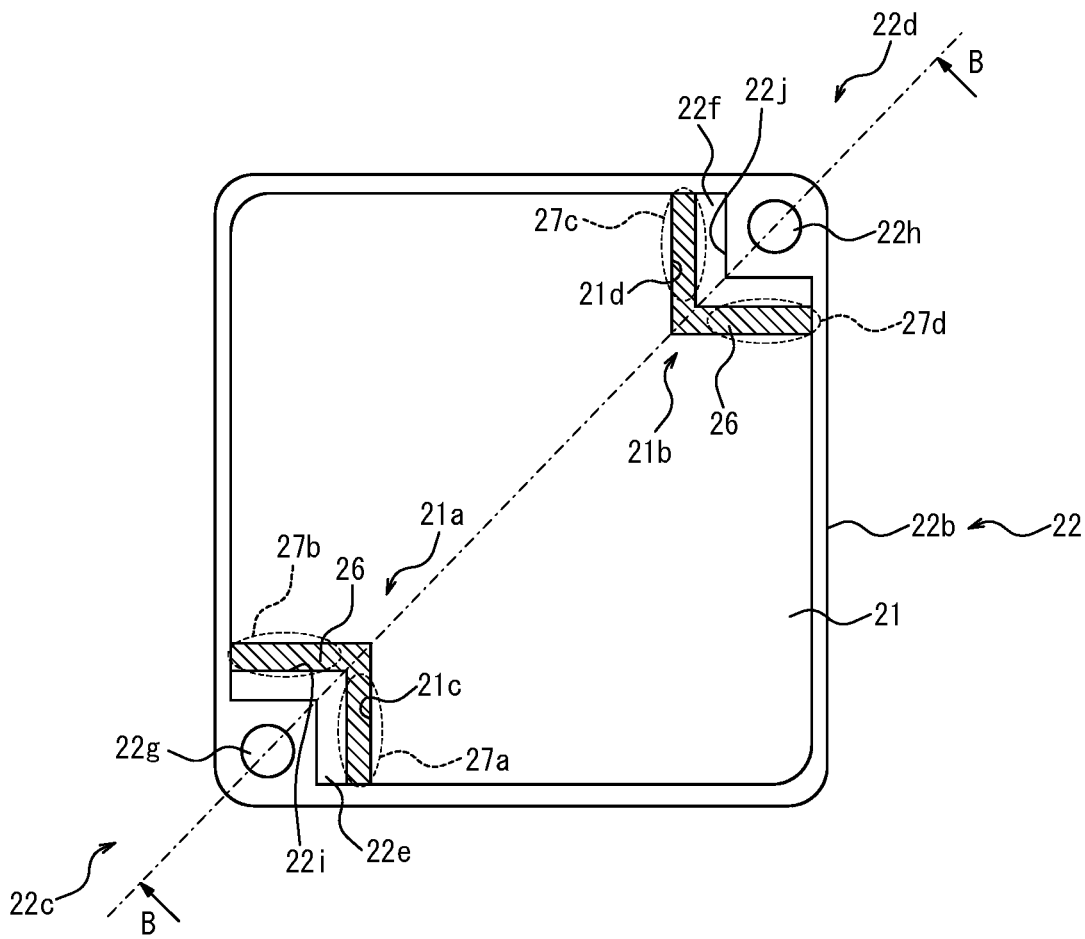
FIG. 8 is a diagram illustrating an adhesion state between a housing and a substrate in an imaging apparatus according to an example variation 1.
Figure 9:
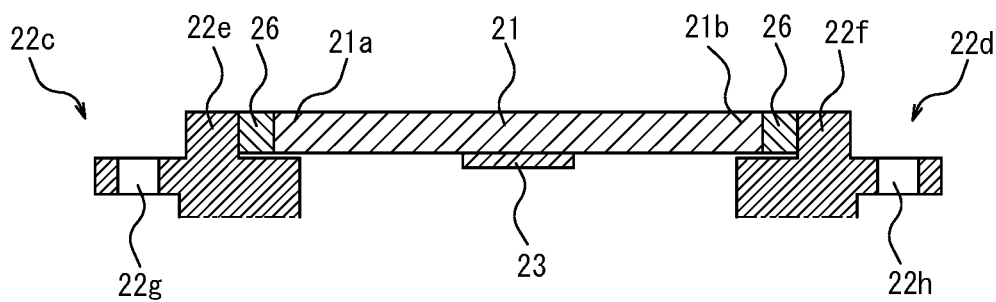
FIG. 9 is a cross-sectional view taken from line B-B of FIG. 8.

Next, an imaging apparatus 20 according to the example variation 1 will be described with reference to FIG. 8 and FIG. 9. FIG. 8 and FIG. 9 are diagrams illustrating an adhesion state between the substrate 21 of the imaging apparatus 20 and the housing 22. Because a configuration of the imaging apparatus 20 is similar to the configuration of the imaging apparatus 10 illustrated in FIG. 1 to FIG. 7, the same or similar elements are denoted by reference signs obtained by adding 10 to the reference signs of corresponding elements of the imaging apparatus 10. Hereinafter, a portion different from the imaging apparatus 10 will be described. Other portions are the same as those of the imaging apparatus 10, and descriptions thereof will thus be omitted.

The imaging apparatus 20 has a shape in which the first diagonal portion 21a and the second diagonal portion 21b of the substrate 21 are cut off in a manner as to remove square portions from right-angled corners when FIG. 8 is viewed from the front side. It can be said that the first diagonal portion 21a and the second diagonal portion 21b of the substrate 21 have respective shapes cut off in a convex shape protruding in an in-plane direction of the substrate 21. Thus, the first substrate side surface 21c of the first diagonal portion 21a and the second substrate side surface 21d of the second diagonal portion 21b are respectively configured with two surfaces parallel to the horizontal and vertical directions when FIG. 8 is viewed from the front side. That is, the first substrate side surface 21c and the second substrate side surface 21d respectively have two surfaces in different orientations.

A base 22b of the housing 22 has a first protrusion 22e and a second protrusion 22f protruding along the normal of the substrate 21 respectively from the first diagonal portion 22c and the second diagonal portion 22*d* toward the side on which the substrate 21 is provided. The first protrusion 22*e* has an inverted L-shape separated from the first substrate side surface 21*c* of the substrate 21 by a predetermined distance. The second protrusion 22*f* has an L-shape separated from the second substrate side surface 21*d* of the substrate 21 by a predetermined distance. The first protrusion 22*e* has a first housing side surface 22*i* opposing the first substrate side surface 21*c*. The second protrusion 22*f* has a second housing side surface 22*j* opposing the second substrate side surface 21*d*.

The adhesive 26 is positioned between the first substrate side surface 21*c* and the first housing side surface 22*i* and between the second substrate side surface 21*d* and the second housing side surface 22*j*. The adhesive 26 positioned between the first substrate side surface 21*c* and the first housing side surface 22*i* has an L-shape or an inverted L-shape having the right-angled corner in the middle when FIG. 8 is viewed from the front side. Thus, contact directions of the adhesive 26 with respect to the substrate 21 are different by approximately 90 degrees between the first region 27*a* and the second region 27*b* located on different sides across the right-angled corner. Similarly, contact directions of the adhesive 26 positioned between the second substrate side surface 21*d* and the second housing side surface 22*j* with respect to the substrate 21 are different by approximately 90 degrees between the third region 27*c* and the fourth region 27*d* located on different sides across the right-angled corner.

In the imaging apparatus 20 according to the present disclosure, the substrate 21 is fixed to the housing 22 by the adhesive 26 as described above. Thus, in a manner similar to the imaging apparatus 10, when a force caused by gravity or a vibration is applied to the adhesive 26, the force is distributed in a shearing direction, a compression direction, a pulling direction, and the like in each different regions of the adhesive 26. As a result, the possibility of peeling and removal of the adhesive 26 can be reduced. Further, because a pair of diagonal portions of the substrate 21 alone are adhered, the housing 22 can be miniaturized and the space saving can be realized.

In the imaging apparatus 20, further, the adhesive 26 in contact with the first substrate side surface 21*c* is separated into the first region 27*a* and the second region 27*b* across the right-angled corner. Thus, a length of the adhesive 26 in contact with the first substrate side surface 21*c* in the horizontal and vertical directions when FIG. 8 is viewed from the front side is longer than that of the imaging apparatus 10 having the first substrate side surface 11*c* formed from a curved surface. The same applies to the second substrate side surface 21*d*. Because the adhesive 26 highly effectively restricts movements in the horizontal and vertical directions orthogonal to each other, the substrate 21 is more securely fixed to the housing 22 in the imaging apparatus 20.

In the example variation 1 described above, the first diagonal portion 21*a* and the second diagonal portion 21*b* of the substrate 21 have respective cut-off shapes at right angles protruding in the in-surface direction of the substrate 21 when viewed from the front side. However, the cut-off shapes of the first diagonal portion 21*a* and the second diagonal portion 21*b* are not limited thereto. The cut-off shapes of the first diagonal portion 21*a* and the second diagonal portion 21*b* may have an angle other than 90 degrees. That is, the first substrate side surface 21*c* and the second substrate side surface 21*d* do not need to be formed from two surfaces orthogonal to each other. Further, the first substrate side surface 21*c* and the second substrate side surface 21*d* may have a shape formed from three or more planes, rather than two planes.

Example Variation 2

Figure 10:
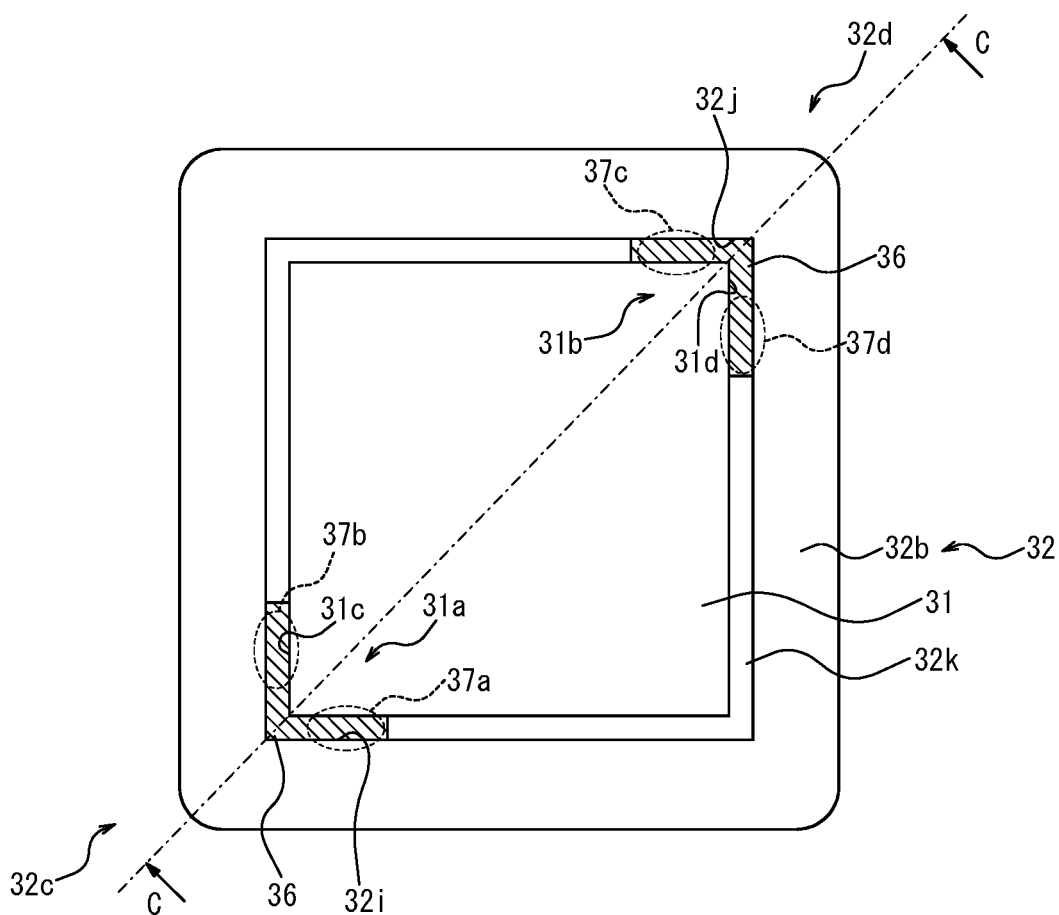
FIG. 10 is a diagram illustrating an adhesion state between a housing and a substrate in an imaging apparatus according to an example variation 2.
Figure 11:
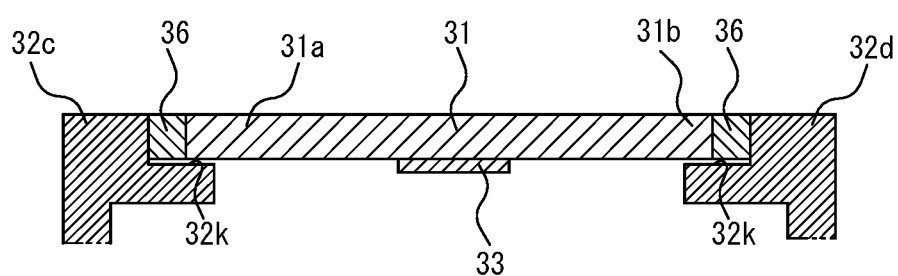
FIG. 11 is a cross-sectional view taken from line C-C of FIG. 10.

An imaging apparatus 30 according to the example variation 2 will be described with reference to FIG. 10 and FIG. 11. FIG. 10 and FIG. 11 are diagrams illustrating an adhesion state between a substrate 31 of the imaging apparatus 30 and a housing 32. Because a configuration of the imaging apparatus 30 is similar to the configuration of the imaging apparatus 10 illustrated in FIG. 1 to FIG. 7, the same or similar elements are denoted by reference signs obtained by adding 20 to the reference signs of corresponding elements of the imaging apparatus 10. Hereinafter, a portion different from the imaging apparatus 10 will be described. Other portions are the same as those of the imaging apparatus 10, and descriptions thereof will thus be omitted.

As illustrated in FIG. 10 and FIG. 11, the substrate 31 of the imaging apparatus 30 has an approximate square shape and does not have a cut-off in the vicinity of each corner. Further, the base 32*b* of the housing 32 of the imaging apparatus 30 does not have a protrusion. The base 32*b* has a recess 32*k* for accommodating the substrate 31. An inner side surface of the recess 32*k*, at least in a first diagonal portion 32*c* and a second diagonal portion 32*d*, is shaped in conformance with shapes of the first diagonal portion 31*a* and the second diagonal portion 31*b* of the substrate 31 having gaps therefrom. An inner side of the recess 32*k* in the first diagonal portion 32*c* where the adhesive 36 is positioned, that is, a side surface opposing the substrate 31 will be referred to as a first housing side surface 32*i*. An inner side of the recess 32*k* in the second diagonal portion 32*d* where the adhesive 36 is positioned, that is, a side surface opposing the substrate 31 will be referred to as a second housing side surface 32*j*. In the substrate 31, the first substrate side surface 31*c* of the first diagonal portion 31*a* and the second substrate side surface 31*d* of the second diagonal portion 31*b* respectively oppose the first housing side surface 32*i* and the second housing side surface 32*j*. The inner side surface of the recess 32*k* may be shaped in conformance with a periphery of the substrate 31 throughout the periphery of the substrate 31.

When FIG. 10 is viewed from the front side, the adhesive 36 is in contact with the first substrate side surface 31*c* and the first housing side surface 32*i* in the vertical direction in the first region 37*a*. Also, the adhesive 36 is in contact with the first substrate side surface 31*c* and the first housing side surface 32*i* in the horizontal direction in the second region 37*b*. The adhesive 36 is in contact with the second substrate side surface 31*d* and the second housing side surface 32*j* in the vertical direction in the third region 37*c*. The adhesive 36 is in contact with the second substrate side surface 31*d* and the second housing side surface 32*j* in the horizontal direction in the fourth region 37*d*. Further, a contact direction of the adhesive 36 with respect to the first substrate side surface 31*c* in the first region 37*a* is opposite to a contact direction of the adhesive 36 with respect to the second substrate side surface 31*d* in the third region 37*c*. A contact direction of the adhesive 36 with respect to the first substrate side surface 31*c* in the second region 37*b* is opposite to a contact direction of the adhesive 36 with respect to the second substrate side surface 31*d* in the fourth region 37*d*. Here, the contact direction or orientation of the adhesive with respect to any given surface is a direction that is orthogonal to the surface in contact with the adhesive and directed toward the contact surface from an adhesive side.

The imaging apparatus 30 according to the example variation 2 can disperse a force caused by gravity or a vibration and reduce the possibility of peeling and removal of the adhesive 36, in a manner similar to the imaging apparatus 20. Also, the substrate 31 can be securely fixed to the housing 32. Further, because the pair of diagonal portions of the substrate 31 alone are adhered, the housing 32 can be miniaturized. For example, in the two diagonal portions other than the first diagonal portion 32c and the second diagonal portion 32d of the housing 32, the housing 32 does not need to protrude from the substrate 31 when viewed from the front side. Accordingly, the housing 32 can be miniaturized by removing the portions in the vicinity of the two corners other than the first diagonal portion 32c and the second diagonal portion 32d from the housing 32 illustrated in FIG. 10.

Example Variation 3

Figure 12:
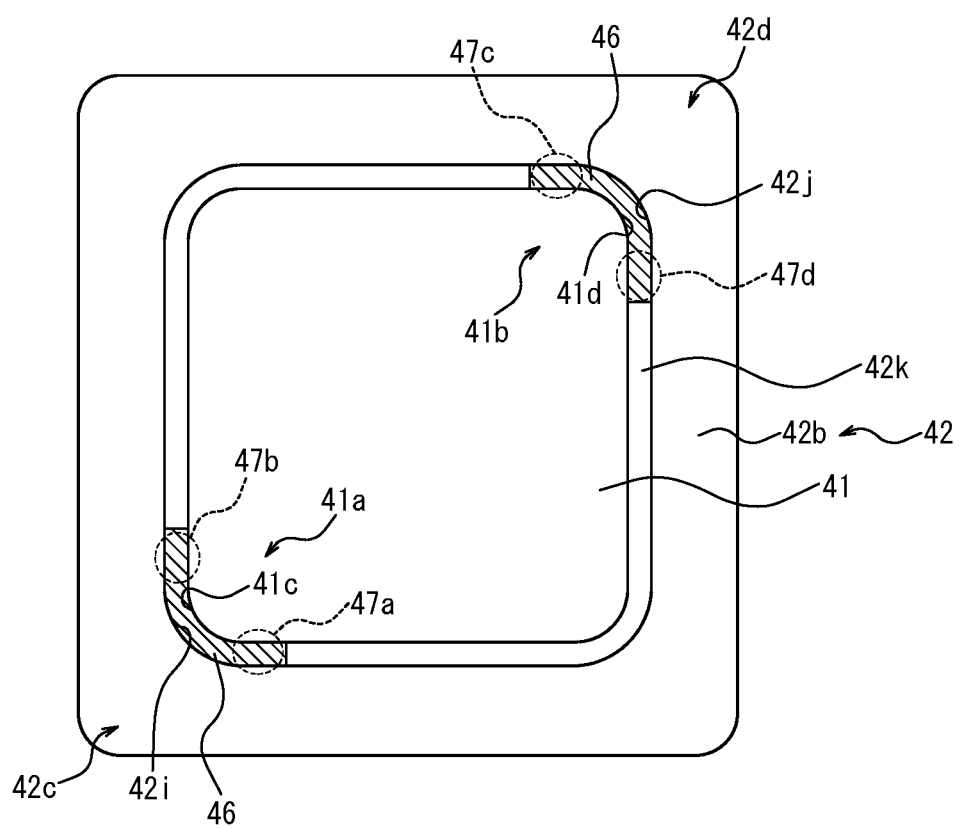
FIG. 12 is a diagram illustrating an adhesion state between a housing and a substrate in an imaging apparatus according to an example variation 3.

An imaging apparatus 40 according to the example variation 3 will be described with reference to FIG. 12. FIG. 12 is a diagram illustrating an adhesion state between a substrate 41 of the imaging apparatus 40 and a housing 42. Because a configuration of the imaging apparatus 40 is similar to the configuration of the imaging apparatus 10 illustrated in FIG. 1 to FIG. 7, the same or similar elements are denoted by reference signs obtained by adding 30 to the reference signs of corresponding elements of the imaging apparatus 10. Because the imaging apparatus 40 is particularly similar to the imaging apparatus 30 according to the example variation 2, a portion of the imaging apparatus 40 different from the imaging apparatus 30 will be described below.

Although the substrate 31 has an approximate square shape in the imaging apparatus 30, a first diagonal portion 41a and a second diagonal portion 41a of a substrate 41 have respective rounded quadrant shapes in the imaging apparatus 40 when FIG. 12 is viewed from the front side. That is, a first substrate side surface 41c and a second substrate side surface 41d respectively have partially curved surfaces similar to a cylindrical surface. Also, a first housing side surface 42i and a second housing side surface 42j of a recess 42k that are located on a housing side and respectively opposing the first substrate side surface 41c and the second substrate side surface 41d have partially curved surfaces similar to a cylindrical surface. An adhesive 46 is positioned between the first substrate side surface 41c and the first housing side surface 42i and between the second substrate side surface 41d and the second housing side surface 42j.

As illustrated in FIG. 12, in a first region 47a located at one end, the adhesive 46 positioned between the first substrate side surface 41c and the first housing side surface 42i is in contact with the first substrate side surface 41c and the first housing side surface 42i in the vertical direction when FIG. 12 is viewed from the front side. In a second region 47b located at the other end, the adhesive 46 is in contact with the first substrate side surface 41c and the first housing side surface 42i in the vertical direction when FIG. 12 is viewed from the front side. In a third region 47c located at one end, the adhesive 46 positioned between the second substrate side surface 41d and the second housing side surface 42j is in contact with the second substrate side surface 41d and the second housing side surface 42j in the vertical direction when FIG. 12 is viewed from the front side. Further, in a fourth region 47d located at the other end, the adhesive 46 is in contact with the second substrate side surface 41d and the second housing side surface 42j in the horizontal direction when FIG. 12 is viewed from the front side. A contact direction of the adhesive 46 with respect to the first substrate side surface 41c in the first region 47a is opposite to a contact direction of the adhesive 46 with respect to the second substrate side surface 41d in the third region 47c. A contact direction of the adhesive 46 with respect to the first substrate side surface 41c in the second region 47b is opposite to a contact direction of the adhesive 46 with respect to the second substrate side surface 31d in the fourth region 47d. Thus, the imaging apparatus 40 according to the example variation 3 has an effect similar to the effect of the imaging apparatus 30 according to the example variation 2.

Example Variation 4

Figure 13:
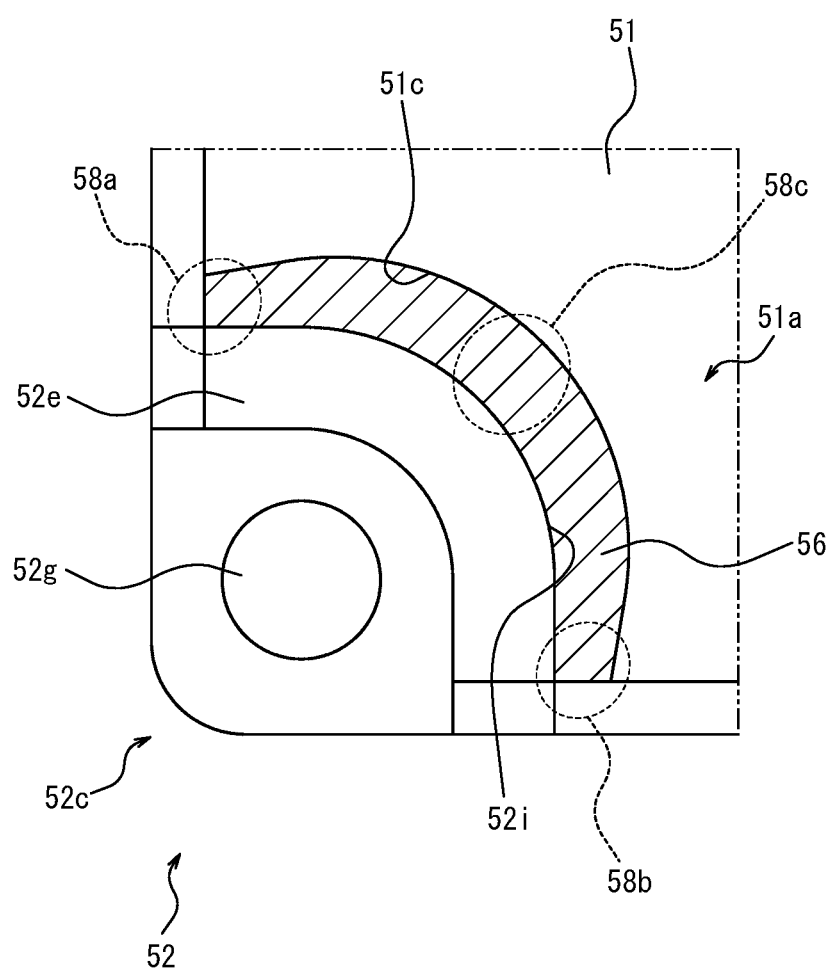
FIG. 13 is an enlarged view of a first diagonal portion of an imaging apparatus according to an example variation 4.

In the imaging apparatus 10 described above, the gap between the first substrate side surface 11c and the first housing side surface 12i having the adhesive 16 arranged therebetween is consistent in the extending direction of the adhesive 16, as illustrated in FIG. 5 by way of example. On the other hand, in an imaging apparatus 50 according to the example variation 4 as illustrated in FIG. 13, a gap between a first substrate side surface 51c and a first housing side surface 52i varies in the extending direction of an adhesive 56. Because a configuration of the imaging apparatus 50 is similar to the configuration of the imaging apparatus 10 illustrated in FIG. 1 to FIG. 7, the same or similar elements of the imaging apparatus 50 are denoted by reference signs obtained by adding 40 to the reference signs of corresponding elements of the imaging apparatus 10, and a portion different from the imaging apparatus 10 will be described.

FIG. 13 illustrates an arrangement of the adhesive 56 between a first diagonal portion 51a of a substrate 51 and a first diagonal portion 52c of a housing 52. End portions of a region in which the adhesive 56 is positioned in FIG. 13 will be respectively referred to as a first end portion 58a and a second end portion 58b. Further, a middle portion located between the first end portion 58a and the second end portion 58b will be referred to as a middle portion 58c. The first end 58a and the second end 58b are narrower than the middle portion 58c. This configuration can restrict a movement of the adhesive 56 in its extending direction when the adhesive 56 of the imaging apparatus 50 is at least partially peeled off from the first substrate side surface 51c and/or the first housing side surface 52i. That is, because a gap between the first substrate side surface 51c and the first housing side surface 52i is reduced, the adhesive 56 positioned in the middle portion 58c is restricted from moving to the first end portion 58a or the second end portion 58b.

A second diagonal portion 51b of the substrate 51 and a second diagonal portion 52d of the housing 52 can be configured in a similar manner. The adhesive 56 positioned between the second diagonal portion 51b and the second diagonal portion 52d is also restricted from moving along the extending direction of the adhesive 56.

The imaging apparatus 50 according to the example variation 4 demonstrates the effect of the imaging apparatus 10 and, further, restricts the movement of the adhesive 56 as described above, whereby the peeling occurred in a portion of the adhesive 56 is suppressed from extending to another portion. Also, the possibility that the adhesive 56 being peeled off moves in the gap between the first diagonal portion 51a and the first diagonal portion 52c and separates from between the first diagonal portion 51a and the first diagonal portion 52c can be reduced.

Example Variation 5

An imaging apparatus 60 according to the example variation 5 is different from the imaging apparatus 50 according to the example variation 4, in terms of a thickness distribution of an adhesive 66 alone. Elements of the imaging apparatus 60 that are the same as or similar to elements of the imaging apparatus 10 are denoted by reference signs obtained by adding 50 to the reference signs of corresponding elements of the imaging apparatus 10, and descriptions thereof will thus be omitted.

Figure 14:
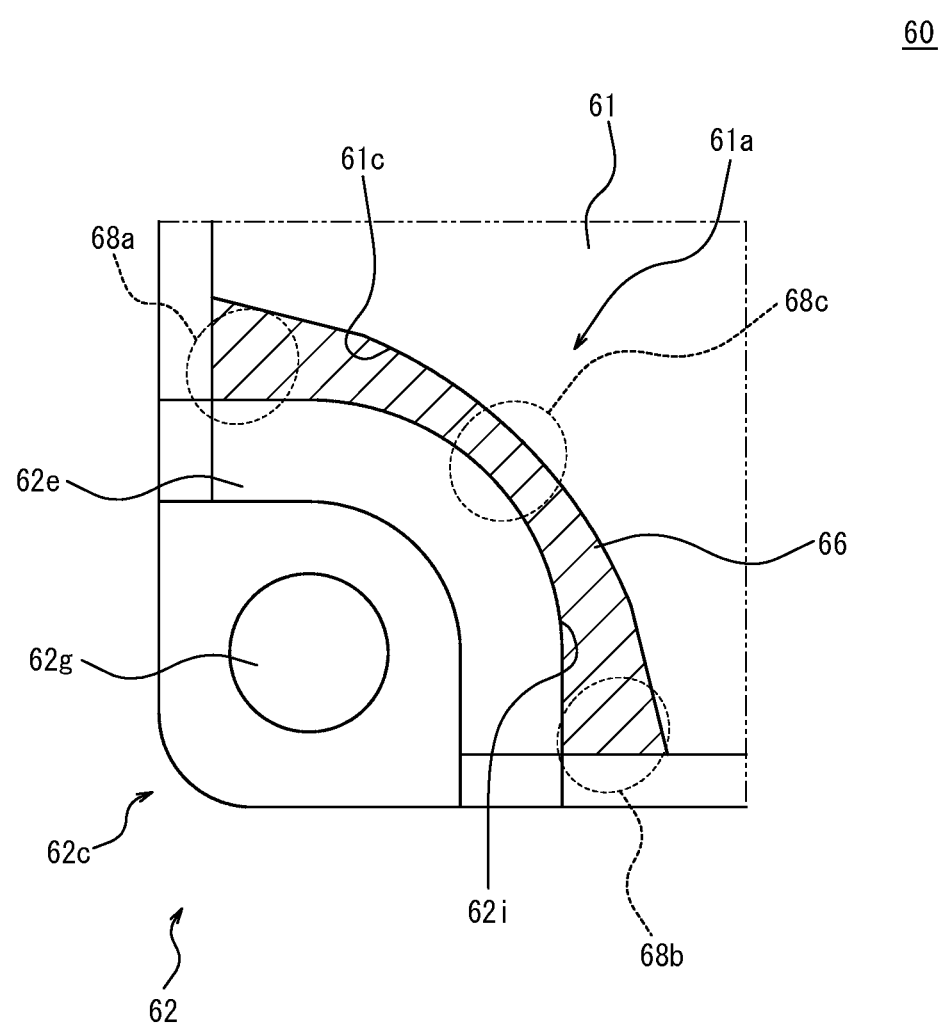
FIG. 14 is an enlarged view of a first diagonal portion of an imaging apparatus according to an example variation 5.

In the imaging apparatus 50, a gap between a first substrate side surface 61c and a first housing side surface 62i is longer in a first end portion 68a and a second end portion 68b than in a middle portion 68c, as illustrated in FIG. 14. Thus, when the peeling occurs at least in partial between the adhesive 66 of the imaging apparatus 60 and the first substrate side surface 61c and/or the first housing side surface 62i, the adhesive 66 is restricted from moving in the extending direction thereof. That is, due to the reduced gap between the first substrate side surface 61c and the first housing side surface 62i, the adhesive 66 positioned at the first end portion 68a and the second end portion 68b is restricted from moving to the middle portion 68c.

A second diagonal portion 61b of a substrate 61 and a second diagonal portion 62d of a housing 62 can be configured in a similar manner. The adhesive 66 positioned between the second diagonal portion 61b and the second diagonal portion 62d is also restricted from moving along the extending direction of the adhesive 66.

Thus, the imaging apparatus 60 according to the example variation 5 demonstrates the effect of the imaging apparatus 10 and, further, when a part of the adhesive 66 is peeled off, the imaging apparatus 60 suppresses a peeled portion from extending to another portion, in a manner similar to the imaging apparatus 50 according to the example variation 4. Further, the imaging apparatus 60 reduces the possibility that the adhesive 66 being peeled off separates from the adhesion position.

Mounting on Mobile Body

Figure 15:
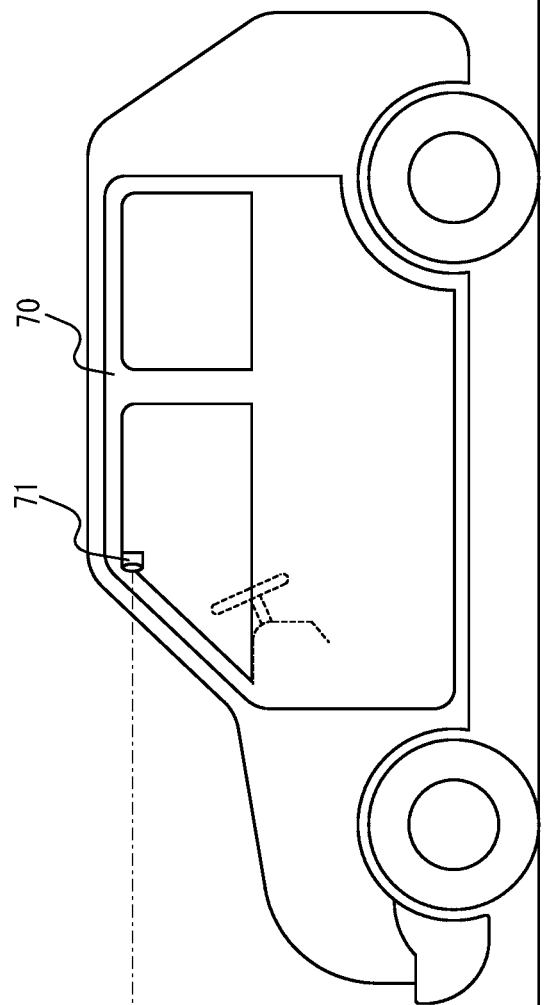
FIG. 15 is a diagram illustrating an example for mounting an imaging apparatus on a vehicle.

The imaging apparatuses 10, 20, 30, 40, 50, and 60 can be mounted on the mobile body including a vehicle. FIG. 15 illustrates an example in which an imaging apparatus 71 serving as one of the imaging apparatuses of the present disclosure is arranged on an inner side of a windshield of a vehicle 70 (the mobile body). The imaging apparatus 71 can take an image of a subject located in front of the vehicle 70 through the windshield. An installation position of the imaging apparatus 71 illustrated in FIG. 15 is merely an example. The imaging apparatus 71 can be installed at various positions in a manner having the optical axis directed in various directions. The imaging apparatus 71 may be fixed to any one of a front bumper, a front grill, a lighting module, a side mirror, a rear bumper, or the like of the vehicle.

The term "mobile body" as used herein encompasses, for example, vehicles, ships, and aircrafts. The term "vehicle" as used herein encompasses, but is not limited to, automobiles, rail vehicles, industrial vehicles, and domestic vehicles. For example, the vehicle may include fixed wing aircrafts that travel on a runway. Automobiles include cars, trucks, buses, motorcycles, and trolley buses, but are not limited thereto and may also include other automobiles that travel on the road. Rail vehicles include locomotives, freight cars, passenger cars, trams, guided track railroads, ropeways, cable cars, linear motor cars and monorails, but are not limited thereto and may also include other vehicles that travel on the track. Industrial vehicles include agricultural vehicles and construction vehicles. Industrial vehicles include, but are not limited to, forklifts and golf carts. Industrial vehicles for agricultural purpose include, but are not limited to, tractors, tillers, transplanters, binders, combined harvesters, and lawn mowers. Industrial vehicles for construction purposes include, but are not limited to, bulldozers, scrapers, excavators, crane trucks, dump trucks, and load rollers. Life vehicles may include, but are not limited to, bicycles, wheelchairs, strollers, wheelbarrows, electric standing two-wheeled vehicles. Power engines of vehicles include, but are not limited to, internal combustion engines including diesel engines, gasoline engines, and hydrogen engines, and electric engines including motors. Vehicles include human-power vehicles traveling on human power. Classification of the vehicles is not limited to the above. For example, vehicles may include industrial vehicles authorized to travel on the road, and a plurality of categories may include the same type of vehicle.

The above embodiment has been described as a representative example. It will be apparent to those skilled in the art that many modifications and substitutions can be made within the spirit and scope of the present disclosure. Thus, the present disclosure should not be construed as being limited by the embodiment and examples described above, and various modifications and/or alterations can be made without departing from the claims.

For example, an imaging apparatus is used as the electronic apparatus in the above embodiment. However, the electronic apparatus is not limited to the imaging apparatus. The present disclosure can be applied to various electronic apparatuses. For example, the electronic apparatus can be a mobile phone, a portable information terminal, a portable music player, an in-vehicle navigation device, an in-vehicle sensor device, or the like. In a case in which the present disclosure is applied to an electronic apparatus other than the imaging apparatus, the optical system including the lens and the image sensor are not essential. Further, the housing does not need to include the lens barrel.

REFERENCE SIGNS LIST 10, 20, 30, 40, 50, 60 imaging apparatus (electronic apparatus)
11, 21, 31, 41, 51, 61 substrate
11a, 21a, 31a, 41a, 51a, 61a first diagonal portion
11b, 21b, 31b, 41b second diagonal portion
11c, 21c, 31c, 41c, 51c, 61c first substrate side surface
11c, 21c, 31c, 41c second substrate side surface
12, 22, 32, 42, 52, 62 housing
12a lens barrel
12b, 22b, 32b, 42b base
12c, 22c, 32c, 42c, 52c, 62c first diagonal portion
12d, 22d, 32d, 42d second diagonal portion
12e, 22e, 52e, 62e first protrusion
12f, 22f second protrusion
12g, 22g, 52g, 62g screw hole
12h, 22h screw hole
12i, 22i, 32i, 42i, 52i, 62i first housing side surface
12i, 22i, 32i, 42i second housing side surface
13, 23, 33 image sensor
14 lens (imaging optical system)

15 circuit component
16, 26, 36, 46, 56, 66 adhesive
17a, 27a, 37a, 47a first region (first adhesion position)
17b, 27b, 37b, 47b second region (second adhesion position)
17c, 27c, 37c, 47c third region (third adhesion position)
17d, 27d, 37d, 47d fourth region (fourth adhesion position)
32k, 42k recess
58a, 68a first end portion
58b, 68b second end portion
58c, 68c middle portion
70 vehicle (mobile body)
71 imaging apparatus
100, 110, 120 attaching configuration
101, 111, 121 housing
101a, 121a protrusion
102, 112, 122 substrate
103a, 103b, 113a, 113b, 123a to 123d adhesive

The invention claimed is:

1. An electronic apparatus comprising:
a substrate having a largest surface;
a housing that has opposing surfaces respectively opposing side surfaces of a pair of diagonal portions of the substrate, and encloses the substrate, the side surfaces of the pair of diagonal portions of the substrate being part of an outermost periphery of the substrate adjacent to the largest surface; and
an adhesive positioned between the side surfaces of the pair of diagonal portions of the substrate and the opposing surfaces of the housing, wherein
a gap between the side surface of the pair of diagonal portions of the substrate and the opposing surface of the housing is inconsistent so as to restrict movement of the adhesive in a direction parallel to the largest surface of the substrate.

2. The electronic apparatus according to claim 1,
wherein the side surfaces of the pair of diagonal portions of the substrate respectively have at least two surfaces in different orientations.

3. The electronic apparatus according to claim 1,
wherein the pair of diagonal portions of the substrate respectively have an arc shape.

4. The electronic apparatus according to claim 1,
wherein the gap is smaller at either end portion of a region in which the adhesive is positioned than at a middle portion of the region.

5. The electronic apparatus according to claim 1,
wherein the gap is larger at either end portion of a region in which the adhesive is positioned than at a middle portion of the region.

6. The electronic apparatus according to claim 1,
wherein the pair of diagonal portions of the substrate includes a first diagonal portion and a second diagonal portion,
a side surface of the first diagonal portion includes a first adhesion position and a second adhesion position in a different orientation from the first adhesion position,
a side surface of the second diagonal portion includes a third adhesion position and a fourth adhesion position in a different orientation from the third adhesion position,
the side surface of the first diagonal portion at the first adhesion position is parallel to the side surface of the second diagonal portion at the third adhesion position, and
the side surface of the first diagonal portion at the second adhesion position is approximately parallel to the side surface of the second diagonal portion at the fourth adhesion position.

7. The electronic apparatus according to claim 6,
wherein the side surface of the first diagonal portion at the first adhesion position and the side surface of the first diagonal portion at the second adhesion position are approximately orthogonal to each other.

8. The electronic apparatus according to claim 1, wherein the pair of diagonal portions of the substrate respectively have a convex cut-off shape protruding in an in-plane direction of the substrate.

9. The electronic apparatus according to claim 1, wherein the adhesive is entirely positioned outside of the outermost periphery of the substrate.

10. An imaging apparatus comprising:
an imaging optical system;
an image sensor configured to convert an image of a subject imaged by the imaging optical system into an electric signal;
a substrate having a circuit component including the image sensor mounted thereon on a main surface of the substrate;
a housing that supports the imaging optical system, has opposing surfaces respectively opposing a pair of diagonal portions of the substrate, and encloses the substrate; and
an adhesive positioned between side surfaces of the pair of diagonal portions of the substrate and the opposing surfaces of the housing, the side surfaces of the pair of diagonal portions of the substrate being part of an outermost periphery of the substrate adjacent to the main surface, wherein
a gap between the side surface of the pair of diagonal portions of the substrate and the opposing surface of the housing is inconsistent so as to restrict movement of the adhesive in a direction parallel to the main surface of the substrate.

11. The imaging apparatus according to claim 10, wherein the adhesive is entirely positioned outside of the outermost periphery of the substrate.

12. The imaging apparatus according to claim 10, wherein the main surface of the substrate is a largest surface of the substrate.

13. A mobile body equipped with an imaging apparatus that includes:
an imaging optical system;
an image sensor configured to convert an image of a subject imaged by the imaging optical system into an electric signal;
a substrate having the image sensor mounted thereon on a main surface of the substrate;
a housing that supports the imaging optical system, has opposing surfaces respectively opposing side surfaces of a pair of diagonal portions of the substrate, and encloses the substrate, the side surfaces of the pair of diagonal portions of the substrate being part of an outermost periphery of the substrate adjacent to the main surface; and
an adhesive positioned between the side surfaces of the pair of diagonal portions of the substrate and the opposing surfaces of the housing, wherein
a gap between the side surface of the pair of diagonal portions of the substrate and the opposing surface of the housing is inconsistent so as to restrict movement of the adhesive in a direction parallel to the main surface of the substrate.

14. The mobile body equipped with the imaging apparatus according to claim 11, wherein the adhesive is entirely positioned outside of the outermost periphery of the substrate.

15. The mobile body equipped with the imaging apparatus according to claim 13, wherein the main surface of the substrate is a largest surface of the substrate.

* * * * *